United States Patent [19]

Binning et al.

[11] Patent Number: 4,762,996
[45] Date of Patent: Aug. 9, 1988

[54] COARSE APPROACH POSITIONING DEVICE

[75] Inventors: Gerd K. Binning, Inning; Christoph E. Gerber, Oberhaching-Deisenhofen, both of Fed. Rep. of Germany

[73] Assignee: International Business Machines Corporation, Armonk, N.Y.

[21] Appl. No.: 40,659

[22] Filed: Apr. 20, 1987

[51] Int. Cl.$^4$ .................. G21K 5/10; G21K 5/08; H01J 37/20
[52] U.S. Cl. .................. 250/306; 250/442.1; 350/530; 74/470; 74/479
[58] Field of Search .................. 250/442.1, 440.1, 306; 350/530, 529; 74/470, 479; 269/310

[56] References Cited

U.S. PATENT DOCUMENTS 3,612,863 10/1971 Suzuki .................. 250/442.1

FOREIGN PATENT DOCUMENTS 0756934 12/1952 Fed. Rep. of Germany ... 250/442.1

Primary Examiner—Craig E. Church
Assistant Examiner—Jack I. Berman
Attorney, Agent, or Firm—John J. Goodwin

[57] ABSTRACT

This die-shaped coarse-approach positioning device is particularly suited for the sample holder of a scanning tunneling microscope or the like. It comprises two blocks (21, 23), one (21) stationary, the other tiltable with respect to the stationary one. The blocks (21, 23) are connected on one side by a spring-like sheet metal (20). The tiltable block (23) can be moved, and with it the sample (33), by turning a screw (28) which presses down onto an elastic pad (30). The tilting of the tiltable block (23) occurs against the effect of the sheet metal (20) until the block (23) touches down onto a wedge (39) insertable in the gap (24) between the blocks (21, 23), and consisting of an elastic material, however, having a spring constant much higher than the effective spring constant of the sheet metal (20). In the application shown, the sample can be lowered onto a tunnel tip (34) attached to a fine-approach positioning device (35).

8 Claims, 2 Drawing Sheets

COARSE APPROACH POSITIONING DEVICE

BACKGROUND OF THE INVENTION

1. Field of the Invention

The invention relates to a coarse-approach positioning device intended for approaching a sample towards a tool or measuring device, or vice versa. In particular, this device may find application in the microscope art, for example in connection with scanning tunneling microscopes or scanning electron microscopes.

2. Description Of The Prior Art

In the microscope art, it is always necessary to position the sample to be investigated as closely as possible to the point of best observation. In the case of the tunneling microscope the sample should be placed at a distance between 0,1 and 1 nanometer from the tunneling tip, in the case of the scanning electron microscope, the sample should be placed at the focal point of the electron beam, again with a tolerance in the nanometer range. The positioning of a sample to within one nanometer from an optimum location usually cannot be accomplished in a single step. Typically, first a coarse approach is performed by which the sample is brought to within one micrometer of the optimum location, and then a fine approach mechanism takes over to accomplish the positioning to the desired tolerance.

Well known in the microscope art are rack-and-pinion devices for coarse adjustment, and screw appliances for fine adjustment. However, it is to be noted that the terms "coarse" and "fine" when used in connection with optical microscopes define an entirely different magnitude of adjustment than is required in connection, for example, with the tunneling microscope. The reason is that the tunneling microscope has a resolution at least three orders of magnitude better than conventional optical microscopes. In other words, the conventional fine-adjustment appliance of an optical microscope is certainly too coarse to serve as the coarse-approach adjustment mechanism for a tunneling microscope.

Several coarse-approach positioning devices for use with the scanning tunneling microscope have already been proposed. All use piezoelectric elements to accomplish movements in steps of several micrometers each, such as those disclosed in EP-A No. 71 666, EP-A No. 160 707, U.S. Pat. No. 4,520,570, IBM Technical Disclosure Bulletin Vol.26, No. 10A (1984) pp. 4898 and 5175. Coarse and fine adjustment can be performed by a device taught by IBM Technical Disclosure Bulletin Vol. 22, No. 7 (1979) p. 2897.

The devices known in the prior art have one or both of the following disadvantages: They do not operate at cryogenic temperatures or in ultra-high vacuum; they transmit vibrations to the sample so that a sharp image of the sample surface cannot be obtained.

SUMMARY OF THE INVENTION

It is accordingly an object of the present invention to propose a coarse approach positioning device which is capable of sustaining cryogenic and ultra-high vacuum environments, and which is of such a rigid construction that vibrations are neither generated nor propagated.

The above-stated and other objects of the invention are achieved by a coarse-approach positioning device for approaching an object to a predetermined position with a resolution on the order of micrometers, particularly for use in the microscope art, which positioning device is characterized in that the object is attached to a movable block which is tiltably supported along one of its edges and balanced between at least a first spring and a second spring, the springs having different spring characteristics, said movable block being tilted through enforced deflection of one of the springs upon actuation by a pressure member, the angle of tilting of said block being determined by the relationship of the spring characteristics of said first and second springs, respectively, such that deflection of said first spring through a predetermined first distance causes a resultant deflection of said second spring through a second distance smaller than said first distance and, hence, causes movement of said block through a third distance smaller by at least one order of magnitude than the movement of said pressure member.

BRIEF DESCRIPTION OF THE DRAWINGS

Details of several embodiments of the coarse-approach positioning device of the present invention will hereafter be described by way of example, with reference to the attached drawings in which.

DESCRIPTION OF THE EMBODIMENT

Figures 1, 2:
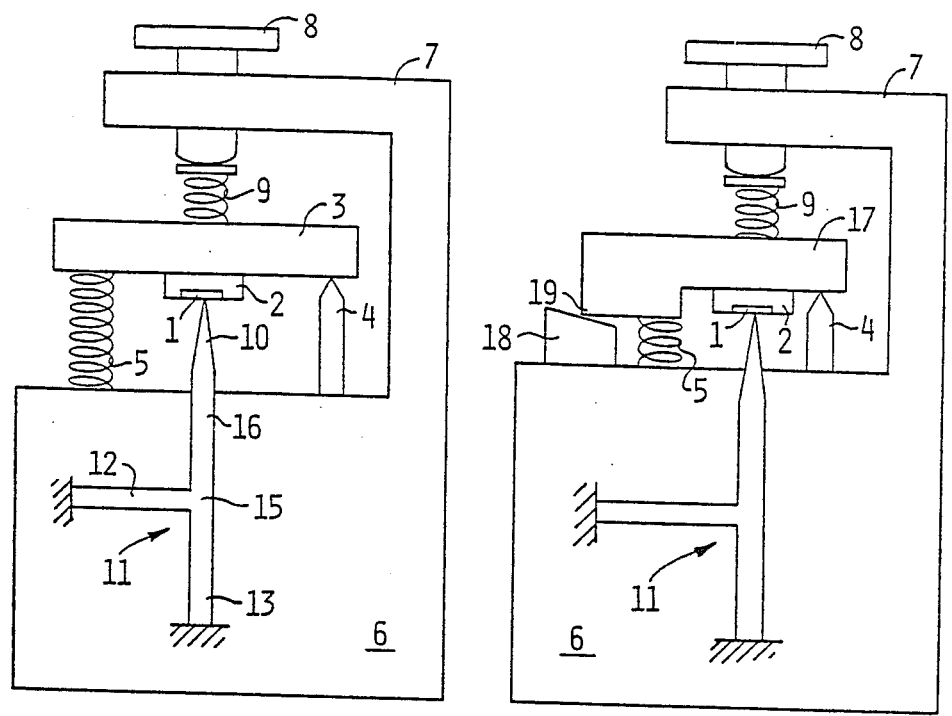
FIG. 1 is a schematic representation of a first embodiment of a coarse-approach positioning device.
FIG. 2 is a schematic representation of a second embodiment of a coarse-approach positioning device.

Referring to FIG. 1, the object or sample 1 to be positioned is attached to a sample holder 2 which in turn is fixed to a block 3. Resting on a tilting knife 4 is one edge of the bottom side of block 3, while the other edge thereof is supported by a first spring 5. Tilting knife 4 and spring 5 rest on a common frame 6 of which one arm 7 supports an adjustment screw 8 which acts on a second spring 9 arranged between said screw 8 and the upper surface of block 3.

Since a scanning tunneling microscope was chosen for the explanation of positioning device in accordance with the invention, a tunnel tip 10 is mounted to a tripod 11 having three legs 12, 13 and 14 (leg 14 extending vertically into the plane of the drawing and not visible in FIG. 1), each leg being associated with one coordinate of an xyz coordinate system and having one end fixed to frame 6. The other ends of legs 12, 13 and 14 are connected in a common joint 15. The legs 12 . . . 14 of tripod 11 may, for example, consist of piezoelectric elements which can be caused to expand or contract by way of applying electric potentials to the electrodes they carry (not shown). Tripods of this type are known in the art, e.g., from IBM Technical Disclosure Bulletin Vol. 27, No.10B (1984) p.5976. With tunnel tip 10 mounted on an arm 16 of tripod 11, even fine-adjustment of the distance between tunnel tip 10 and sample 1 can be performed.

In FIG. 1, sample 1 is supported between two springs, 5 and 9. Depending on the ratio of the spring constants, i.e., with spring 5 being harder than spring 9, the resulting movement of sample 1 will be proportionally smaller than the movement of screw 8 when turned.

It is to be understood that the tilting action performed by block 3, as screw 8 is lowering and compressing spring 5, is so small that for the purposes of this invention the motion of sample 1 attached to block 3 can be considered linear, as opposed to occurring on a circle, as is mathematically correct.

One embodiment of the coarse-approach positioning device in accordance with FIG. 1 had an eigenfrequency against the tripod that was considered too low, leading to a tendency of propagating vibrations. This disadvantage can be overcome with a positioning device in accordance with FIG. 2.

Referring to FIG. 2, there is shown sample 1 held by a sample holder 2 which is attached to a block 17 that rests, along one edge, on a tilting knife 4. Block 17 is balanced between springs 5 and 9 which may have different spring constants as explained above. So far, this arrangement is similar to the embodiment in accordance with FIG. 1. The approach of sample 1 towards tunnel tip 10 down to a distance of about 2 micrometers may be controlled with an optical microscope, or by field-emission under ultra-high vacuum. When this distance is reached, spring 5 is complemented with a considerably harder spring which may take the form of a wedge 18 resting on frame 6.

By turning screw 8 and compressing springs 5 and 9, block 17, with its shoulder 19, will eventually touch down upon wedge 18 so that block 17 will become balanced between spring 9 and wedge 18, with spring 5 only contributing negligibly. Wedge 18 may, e.g., consist of rubber, or better viton, but in any case must have a spring constant at least one order of magnitude greater than spring 5. As screw 8 is now turned further, block 17 will be moving at a considerably slower pace than before.

Figure 4:
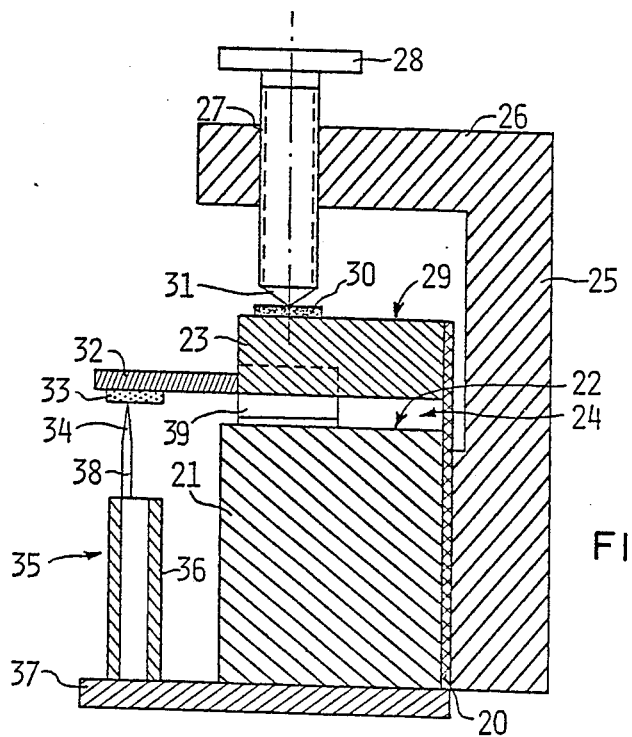
FIG. 4 is a cross section along line A—A of the embodiment of FIG. 3 (not to scale).
Figure 3:
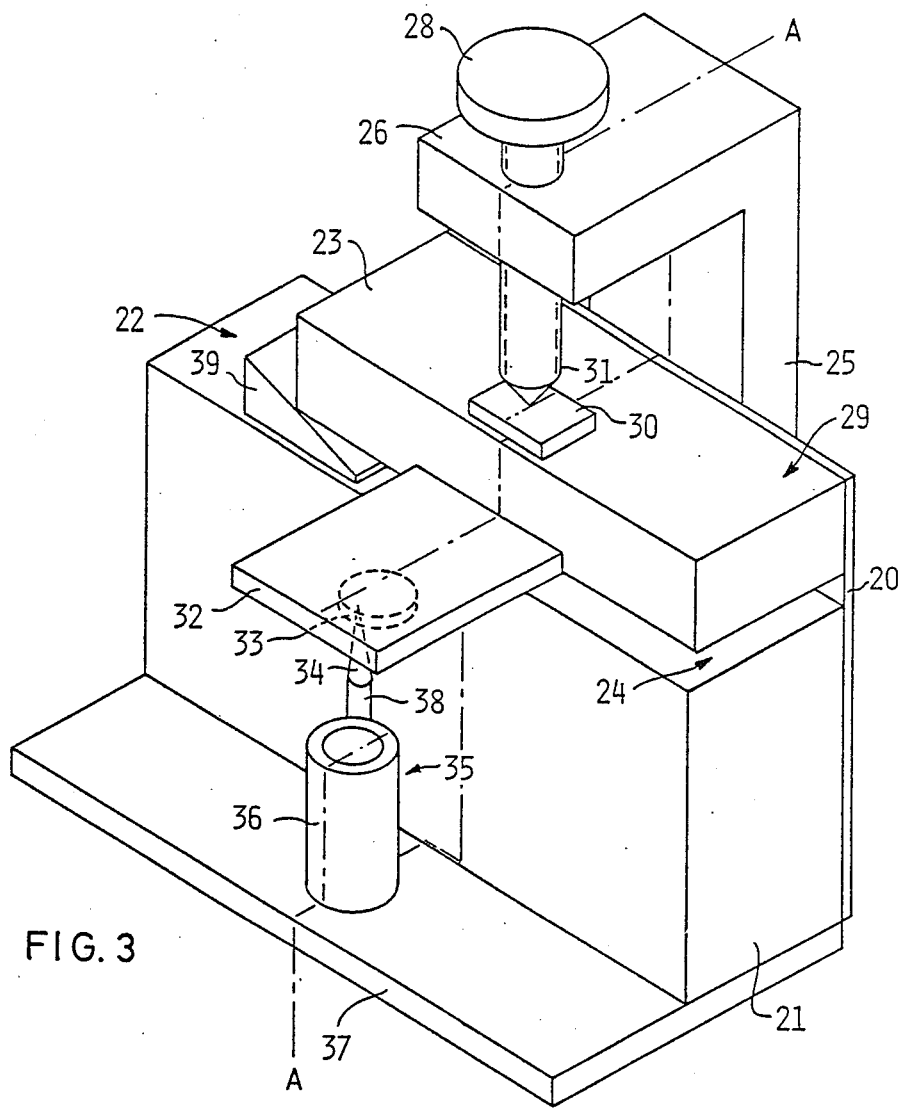
FIG. 3 is a perspective view of a third embodiment of the invention.

Still another embodiment of the positioning device in accordance with the invention is shown in FIGS. 3 and 4 being, respectively, a perspective view and a cross section of the same embodiment (though not drawn to scale). In the embodiment of FIGS. 3 and 4, tilting knife (4) and spring (5) on which the block (3, 17) carrying the sample (1) rests in FIGS. 1 and 2, have been combined into one single element, viz. a leaf spring (20).

Referring to FIGS. 3 and 4, leaf spring 20 is fixed to a frame 21 (equivalent of frame 6 in FIGS. 1 and 2) and extends beyond the upper surface 22 thereof. Attached to leaf spring 20 is a block 23 in such a way that a gap 24 is formed between frame 21 and block 23. Gap 24, of course, extends parallel with the surface 22 of frame 21. An arm 25 is screwed to frame 21 on the back of leaf spring 20 such that block 23 is free to move without interfering with arm 25, as shown in FIG. 4. Arm 25 in its horizontal section 26 has a thread 27 with very low pitch, which accommodates a pressure screw 28.

On the top surface 29 of block 23 there rests a pad 30 consisting of elastic material. The lower end 31 of screw 28 is aligned to engage pad 30 when screw 28 is threaded through. The pressure thus exerted on pad 30 will cause block 23 to be tilted to the left in FIG. 4 as leaf spring 20 bends. The amount of tilting of block 23 is determined by the geometric parameters of the embodiment including, of course, the movement of screw 28, as well as by the relationship of the spring constants of elastic pad 30 and leaf spring 20, respectively. As a general rule, the spring constant of leaf spring 20 will be chosen much higher than that of pad 30.

Extending from block 23 at the side opposite leaf spring 20 is a sample holder 32. Held on the lower surface of sample holder 32 is the sample 33 to be inspected. The inspection is made with the aid of a sharply pointed tunnel tip 34 which is attached to a fine-approach and scanning device 35. Device 35 may, e.g., comprise the tripod 11 of FIGS. 1 and 2. In the embodiment of FIGS. 3 and 4 it is realized in the form of a piezoceramic tube 36 which, together with frame 21, rests on a common base plate 37. As is known in the art, tube 36 carries pairs of electrodes attached to diagonally opposite surface areas thereof which, when energized with voltages of appropriate waveform and phase, enable tube 36 to perform linear or circular motion. Attached to the upper end of tube 36 is tunnel tip 34. As tube 36 moves, tunnel tip 34 scans the surface of sample 33 along such tracks as determined by the voltages applied.

Either the stem 38 of tunnel tip 34 or the fine-approach and scanning device 35 may be designed to be controllable by a feedback signal derived from the tunneling current flowing across the tunnel gap between tunnel tip 34 and sample 33, and being a measure for the width of that gap, as is well known in the scanning tunneling microscope art.

The tilting movement of block 23 and, hence, the (essentially) vertical movement of sample 33 are derived from the movement of screw 28 as modified by the relationship of the spring constants of leaf spring 20 and elastic pad 30. With the arrangement of FIGS. 3 and 4 so far described it will be possible to approach sample 33 towards tunnel tip 34 to within a fraction of one micrometer.

When that distance has been reached,—and this can be determined through inspection with an optical microscope,—the relationship of the spring constants is changed by inserting a wedge 39 into gap 24 so that block 23 with one edge now rests on said wedge. The movement of block 23, as screw 28 is turned, now depends on the relationship of the spring constants of pad 30 and wedge 39. In this case, the contribution of leaf spring 20 is negligible.

With wedge 39 inserted in gap 24, and wedge 39 assumed to consist of a material with low elasticity, it is easily possible to position sample 33 within the tunneling region, i.e., with a gap between sample 33 and tunnel tip 34 on the order of one nanometer.

As mentioned before, fine adjustment during scanning operation is made by energizing fine-approach device 35.

Having thus described our invention. What we claim as new and desire to secure by Letters Patent is:

1. Coarse-approach positioning device for approaching an object to a predetermined position with a resolution on the order of micrometers, particularly for use in the microscope art, characterized in that the object (1, 33) to be positioned is attached to a movable block (3, 17, 23) which is tiltably supported (4, 20) along one of its edges and balanced between at least a first spring (5, 20) and a second spring (9, 30) having different spring characteristics, said movable block (3, 17, 23) being tilted through enforced deflection of one of the springs (9, 30), upon actuation of a pressure member (8), the angle of tilting of said block (3, 17, 23) being determined by the relationship of the spring characteristics of said first and second springs (5, 20; 9, 30), respectively, such that deflection of the said first spring (9, 30) through a predetermined first distance causes a resultant deflection of said second spring (5, 20) through a second distance smaller than said first distance and, hence, causes movement of said block (3, 17, 23) through a third distance smaller by at least one order of magnitude than the movement of said pressure member (8).

2. Positioning device in accordance with claim 1, characterized in that said block (17, 23) is tiltably supported (4, 20) along one of its edges and balanced between said first spring (9, 30) and a second spring (5, 20) during its tilting through a predetermined angle, and balanced between said first spring (9, 30) and a third spring (18, 39) during its tilting beyond said predetermined angle, said third spring (18, 39) having a spring constant greater than the one of said second spring (5, 20), such that continued deflection of said first spring (9, 30) through a given distance for the tilting of said block (17, 23) beyond said predetermined angle and with said third spring (18, 39) being active, results in a tilting action through a fourth distance still smaller than said third distance.

3. Positioning device in accordance with claim 1, characterized in that said block (3) is supported on a knife (4) and a first spring (5), both resting on a common frame (6), that on the top of said block (3) a second spring is arranged which can be compressed against said block (3) by means of a manually operable screw (8) turnably supported by a thread in an arm (7) extending from said frame (6), said block (3) performing a tilting movement about said knife (4) so as to approach said object (1) towards a working position which may be defined as the focal point of a lens system, and/or as the tunneling region in a tunneling microscope.

4. Positioning device in accordance with claim 2, characterized in that for tilting through said predetermined angle said block (17) is supported on a knife (4) and a first spring (5), both resting on a common frame (6), that on the top of said block (17) a second spring (9) is arranged which is compressible against said block (17) by means of a manually operable screw (8) turnably supported in a thread in an arm (7) extending from said frame (6), and that for tilting beyond said predetermined angle, said first spring (5) automatically becomes replaced by a third spring (18) arranged in juxtaposition with said first spring (5) but much harder than the latter.

5. Positioning device in accordance with claim 2, characterized in that for tilting through said predetermined angle said block (23) is supported by a leaf spring (20) attached along one side of said block (23) and to a frame (21) so as to keep said block (23) in a parallel relationship with said frame (21) with a gap (24) in between, that on the top of said block (23) an elastic pad (3) is arranged for cooperation with a pressure screw (28) supported in a thread (27) of an arm (26) fixed to said frame (21), and that for tilting of said block (21) beyond said predetermined angle, said leaf spring (20) automatically becomes shunted by a third spring (39) insertable into said gap (24) between said block (23) and said frame (21).

6. Positioning device in accordance with claim 5, characterized in that said object (33) is attached to a holder (32) extending from said block (23) and is aligned with a fine-approach and scanning device (35) carrying a tunnel tip (34).

7. Positioning device in accordance with claim 4 or claim 5, characterized in that said third spring takes the form of a wedge (18, 39) made of elastic material.

8. Positioning device in accordance with claim 7, characterized in that said predetermined angle through which said first spring (5, 20) is active, is adjustable through insertion and retraction of said wedge (18, 39) in said gap (24) between said block (17, 23) and said frame (6, 21).

* * * * *